US005119048A

United States Patent [19]

Grunwell

[11] Patent Number: 5,119,048

[45] Date of Patent: Jun. 2, 1992

[54] PSEUDO TAPERED LINES USING MODIFIED GROUND PLANES

[76] Inventor: Randall L. Grunwell, 10103 Patience La., Royal Palm Beach, Fla. 33411

[21] Appl. No.: 609,343

[22] Filed: Nov. 5, 1990

[51] Int. Cl.$^5$ .................. H03H 7/38

[52] U.S. Cl. .................. 333/34; 333/246

[58] Field of Search .................. 333/34, 33, 32, 246, 333/238

[56] References Cited

U.S. PATENT DOCUMENTS 3,523,260 8/1970 Gunshinan et al. .................. 333/34

4,543,544 9/1985 Ziegner .................. 333/34

FOREIGN PATENT DOCUMENTS 0158701 12/1980 Japan .................. 333/33

*Primary Examiner*—Eugene R. LaRoche

*Assistant Examiner*—Seung Ham

*Attorney, Agent, or Firm*—Michael J. Buchenhorner

[57] ABSTRACT

A network (10) for matching impedance from a first transmission line (14) to a second transmission line (16) includes a dielectric material (12, 20), a conductor (24, 26, 28), and metalization (18, 30) located on at least some portions of at least one outer surface of the dielectric material. The area covered by the metalization gradually diminishes from the first transmission line to the second transmission line. The conductor provides an electrical connection between the first transmission line and the second transmission line. The conductor provides an electrical connection between the first transmission line and the second transmission line, and is located at least partially within the dielectric material.

6 Claims, 1 Drawing Sheet

PSEUDO TAPERED LINES USING MODIFIED GROUND PLANES

TECHNICAL FIELD

This invention relates generally to impedance matching networks.

BACKGROUND

In radio communications circuits there often arises a need for impedance matching over a wide range of frequencies. Such matching may be achieved using tapered stripline techniques, however the widths of those striplines may be a problem where small size is required. Thus a need exists for a wide-band impedance-matching network with minimum size.

SUMMARY OF THE INVENTION

Briefly, according to the invention, a network for matching impedance from a first transmission line to a second transmission line includes a dielectric material, a conductor, and metalization located on at least some portions of at least one outer surface of the dielectric material. The area covered by the metalization on at least one outer surface of the dielectric material gradually diminishes from the first transmission line to the second transmission line. The conductor provides an electrical connection between the first transmission line and the second transmission line, and is located at least partially within the dielectric material.

DETAILED DESCRIPTION OF THE PREFERRED EMBODIMENT

Figure 1:
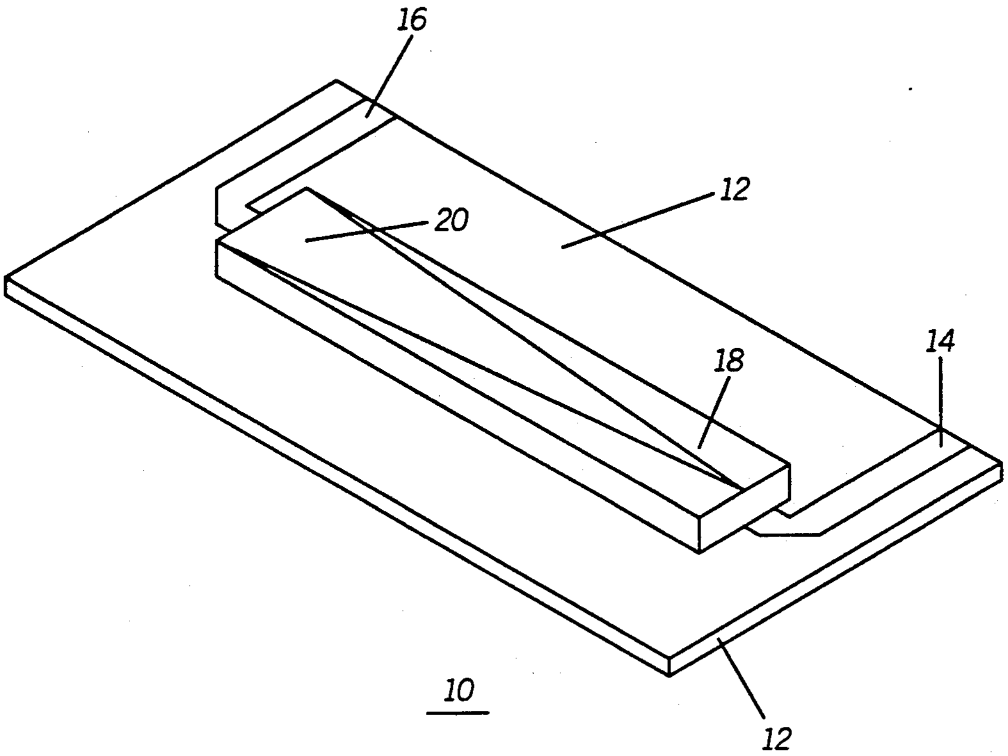
FIG. 1 shows an impedance matching network in accordance with the invention.

Referring to FIG. 1, there is shown an impedance matching network 10 for matching the impedance of a first transmission line 14 to that of a second transmission line 16, in accordance with the invention. The impedance matching network 10 comprises a first dielectric (or cover substrate) 20 and a second dielectric (or base substrate) 12. Alternatively, a single dielectric can be used instead of the first and second dielectrics. In such a case, a central conductor would be located within the single dielectric.

Figure 2:
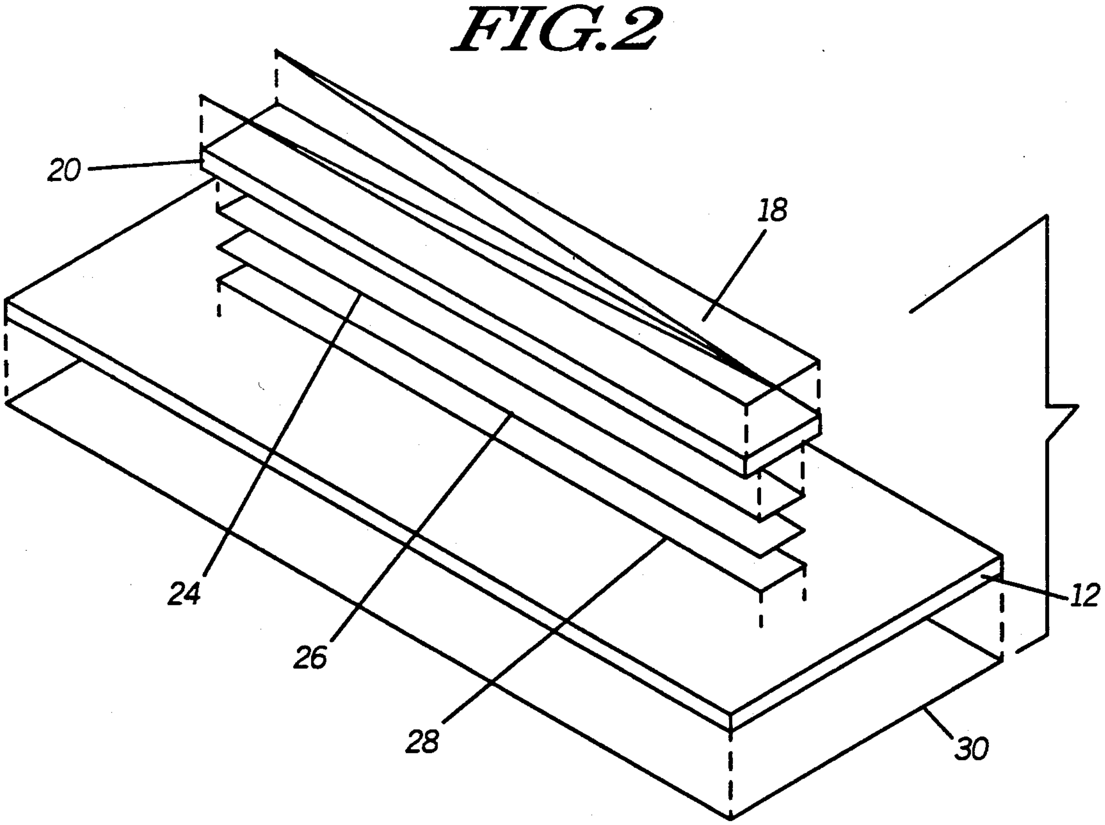
FIG. 2 is an exploded view of the impedance the matching network of FIG. 1.

Referring to FIG. 2, there is shown an exploded view of the impedance the matching network 10 of FIG. 1. A base transmission line 28, located (e.g., plated) on the top surface of the base substrate 12 is connected to a cover transmission line 24 by a layer of solder 26, thus forming a central conductor for providing a connection between the first transmission line 14 and the second transmission line 16. The resulting central conductor is disposed between the cover substrate 20 and the base substrate 12. A cover ground plane 18 is located on the side (or surface) of the cover substrate that is opposite the side on which the cover transmission line 24 is located. The area (i.e., the covering area) of the cover ground plane 18 gradually diminishes from the first transmission line 14 to the second transmission line 16, thus varying the impedance of that structure until the desired match is obtained. The area of the metalization 18 may be varied by forming tapered conducting shapes on the top side of the first substrate. However, it should be appreciated that the area may be varied in other gradual manners (e.g., by forming steps on the metalization). A base metalization 30 forming a base ground plane is located on the side (or surface) of the base substrate opposite from the side on which the base transmission line 28 is located. In addition, the area of base metalization 30 may also be varied in a manner similar to that used with respect to cover metalization 18, thus providing a similar impedance match.

Both the cover and base metalizations are connected to ground potential (not shown) to form ground planes. Therefore, the matching network 10 represents a stripline at the end connected to the first line 14, and a microstrip line at the end connected to the second line 16. By using this stripline-like structure the size of the matching network 10 is small compared to a tapered microstrip impedance matching network. The embodiment of the invention depicted in the figures may be used to transform 27 Ohms to 50 Ohms with an input return loss of 15 decibels, or better, from below 350 Megahertz to over 1.5 Gigahertz, for example. Thus, a wide-band impedance-matching network with minimum size is provided.

What is claimed is:

1. A network for matching impedance from a first transmission line to a second transmission line, comprising:

a first substrate having a top surface and a bottom surface;

a second substrate having a top surface and a bottom surface, the top surface of the second substrate being attached to the bottom surface of the first substrate;

a conductor, disposed between the first substrate and the second substrate and providing an electrical connection between the first transmission line and the second transmission line; and metalization located on a first covered area on the top surface of the first substrate and on a second covered area on the bottom surface of the second substrate, said metalization at least the first covered area decreasing from the first transmission line to the second transmission line.

2. The network of claim 1 wherein at least part of the metalization has a substantially tapered shape.

3. The network of claim 1 wherein the conductor comprises a base transmission line connected to a cover transmission line.

4. A network for matching impedance from a first transmission line to a second transmission line, comprising:

a first substrate having a top surface and a bottom surface;

a second substrate having a top surface and a bottom surface, the top surface of the second substrate being attached to the bottom surface of the first substrate;

a conductor, disposed between the first substrate and the second substrate for providing an electrical connection between the first transmission line and the second transmission line; and a first metalization located on the top surface of the first substrate;

a second metalization, connected to the first metalization, and located on the bottom surface of the second substrate, the second metalization gradually decreasing in area from the first transmission line to the second transmission line.

5. The network of claim 4 wherein the first metalization covers substantially the entire top surface of the first substrate.

6. The network of claim 4 wherein the first metalization covers an area on the top surface of the first substrate gradually decreasing from the first transmission line to the second transmission line.

* * * * *